United States Patent
Chang et al.

(10) Patent No.: US 9,622,337 B1
(45) Date of Patent: Apr. 11, 2017

(54) ANTI-SULFURIZATION MEMORY STORAGE DEVICE

(71) Applicant: Apacer Technology Inc., New Taipei (TW)

(72) Inventors: Chih-Liang Chang, New Taipei (TW); Min-Huang Chou, New Taipei (TW)

(73) Assignee: Apacer Technology Inc., New Taipei (TW)

( * ) Notice: Subject to any disclaimer, the term of this patent is extended or adjusted under 35 U.S.C. 154(b) by 0 days.

(21) Appl. No.: 15/257,002

(22) Filed: Sep. 6, 2016

(30) Foreign Application Priority Data

May 24, 2016 (TW) .............................. 105116035 A

(51) Int. Cl.
*G11C 5/06* (2006.01)
*H05K 1/02* (2006.01)
*G11C 13/00* (2006.01)

(52) U.S. Cl.
CPC ....... *H05K 1/0213* (2013.01); *G11C 13/0021* (2013.01); *H05K 2201/10022* (2013.01); *H05K 2201/10159* (2013.01)

(58) Field of Classification Search
CPC ....... G11C 5/063; G11C 7/18; G11C 13/0021; H05K 1/0123
USPC .......................................................... 365/63
See application file for complete search history.

(56) References Cited

U.S. PATENT DOCUMENTS

2013/0335191 A1* 12/2013 Belman ................. H01C 1/034
338/262

* cited by examiner

*Primary Examiner* — Huan Hoang
(74) *Attorney, Agent, or Firm* — Muncy, Geissler, Olds & Lowe, P.C.

(57) ABSTRACT

An anti-sulfurization memory storage device is provided, which includes a connection interface unit, a plurality of volatile memory units and a printed circuit board. The connection interface unit is configured to communicate with a host. The printed circuited board may include a plurality of anti-sulfurization passive components and a protective film. The plurality of anti-sulfurization passive components are configured to control and transmit a current to a plurality of volatile memory units. The protective file is configured to cover the printed circuit board. Wherein, the plurality of anti-sulfurization passive components may include an anti-sulfurization resistor and an anti-sulfurization resistor network.

9 Claims, 3 Drawing Sheets

ANTI-SULFURIZATION MEMORY STORAGE DEVICE

CROSS-REFERENCE TO RELATED APPLICATION

This application claims priority from Taiwan Patent Application No. 105116035, filed on May 24, 2016 in the Taiwan Intellectual Property Office, the content of which is hereby incorporated by reference in its entirety for all purposes.

BACKGROUND OF THE INVENTION

1. Field of the Invention

The present invention relates to a memory storage device, particularly, an anti-sulfurization memory storage device.

2. Description of the Related Art

A memory storage device is a key component of an electronic device and its function is to store or temporarily store the digital data of the electronic device. In general, memory devices are of three main types: Unbuffered Dual In-line Memory Module (UDIMM), Registered Dual In-line Memory Module (RDIMM), and Small Outline Dual In-line Memory Module (SODIMM). No matter what type of memory device it is, the devices all include a printed circuit board (PCB), at least one volatile memory unit and a plurality of passive components, wherein the volatile memory unit and the passive components are installed on the PCB and the passive components are used to control the amount of electrical current transmitted from the host. Under normal operating conditions, the lifetime of a memory device can stretch from 5 to 10 years and, in some cases, over 10 years.

Due to the popularization of the electronic devices, the devices may be installed in outdoor facilities. As a result, the probability that the memory devices are exposed to any compound harmful to the device or water molecules in the air increases significantly, resulting in the shortening of the lifetime of the memory device. For instance, resistors currently used in memory storage devices contain silver. When such a resistor comes into contact with the molecules containing sulfur atoms in the air, the conductive layer containing silver will react chemically with such molecules to produce silver sulfide, which is insulating. This causes the gradual change of the conductive layer into an insulator. Eventually, electrical current can no longer pass through the resistor and the memory device ceases to function. Evidence of the formation of such silver sulfide is demonstrated in FIG. 1. In other cases, when there is excessive moisture in the air, it may cause moisture damage to the passive component in the memory storage device, and the memory device will cease functioning.

SUMMARY OF THE INVENTION

The objective of the present invention is to provide an anti-sulfurization memory storage device to address the aforementioned limitations of the prior art.

To that aim, the present invention provides an anti-sulfurization memory storage device, including a connection interface unit, a plurality of volatile memory units and a printed circuit board. The connection interface unit may be coupled to a host. The printed circuited board may include a plurality of anti-sulfurization passive components and a protective film; the plurality of anti-sulfurization passive components may be used to control and transmit the electrical current to the plurality of volatile memory units; the protective film may be used to cover the printed circuit board, wherein the plurality of anti-sulfurization passive components may include an anti-sulfurization resistor and an anti-sulfurization resistor network.

Preferably, the nominal resistance of the anti-sulfurization resistor is 240 ohms.

Preferably, the tolerance of the anti-sulfurization resistor is 5%.

More preferably, the tolerance of the anti-sulfurization resistor is 3%.

Even more preferably, the tolerance of the anti-sulfurization resistor is 1%.

Preferably, the lowest value of the resistance of the anti-sulfurization resistor network is 15 ohms.

Preferably, the highest value of the resistance of the anti-sulfurization resistor network is 39 ohms.

Preferably, the connection interface unit may be a metal terminal and the thickness of the metal terminal may be between 20 and 30 micrometers.

More preferably, the connection interface unit may be a metal terminal and the thickness of the metal terminal may be between 35 and 45 micrometers.

In accordance with the preceding description, the anti-sulfurization memory storage device of the present invention has one or more than one of the following advantages:

(1) The anti-sulfurization memory storage device of the present invention is able to prevent the passive components from reacting chemically with harmful compounds in the air, resulting in a prolonged lifetime for the anti-sulfurization memory storage device.

(2) The protective film of the anti-sulfurization memory storage device of the present invention provides the protection against moisture, dust and fouling.

(3) The connection interface unit of the anti-sulfurization memory storage device of the present invention has high resistance against wear and high hot-plug cycle count, as well as capable of providing a more stable signal transmission.

(4) The tolerance of the resistor in the anti-sulfurization memory storage device of the present invention can be reduced to a margin of ±1%, so that the precision of the electrical current transmitted through the resistor is higher.

BRIEF DESCRIPTION OF THE DRAWINGS

The detailed description of the present invention given below is for illustration purposes only, and thus does not limit the scope of the present invention, wherein.

DESCRIPTION OF THE PREFERRED EMBODIMENTS

To illustrate and explain the novel features, contents, and advantages of the present invention, and the effect that can be achieved therefrom; detailed descriptions of the preferred embodiments of the present invention are herein provided, and these reference the accompanying diagrams. It should be noted, however, that the diagrams and exemplary embodiments herein used, are for the purpose of illustrating and explaining the specification of the present invention, without necessarily implying the actual size, ratio, or precise configuration. Therefore, in the accompanied diagrams, the size, ratio and configuration shall not be interpreted in any way that limits the scope, applicability or configuration of the present invention.

Figure 1:
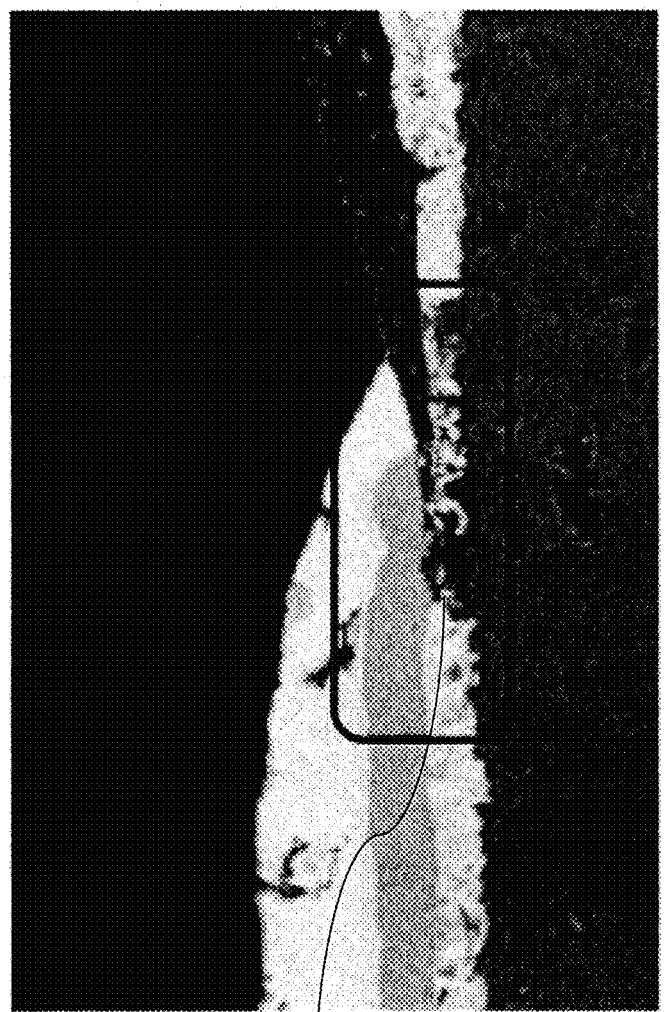
FIG. 1 is an electron micrograph showing the silver sulfide formed on a passive component.
Figure 2:
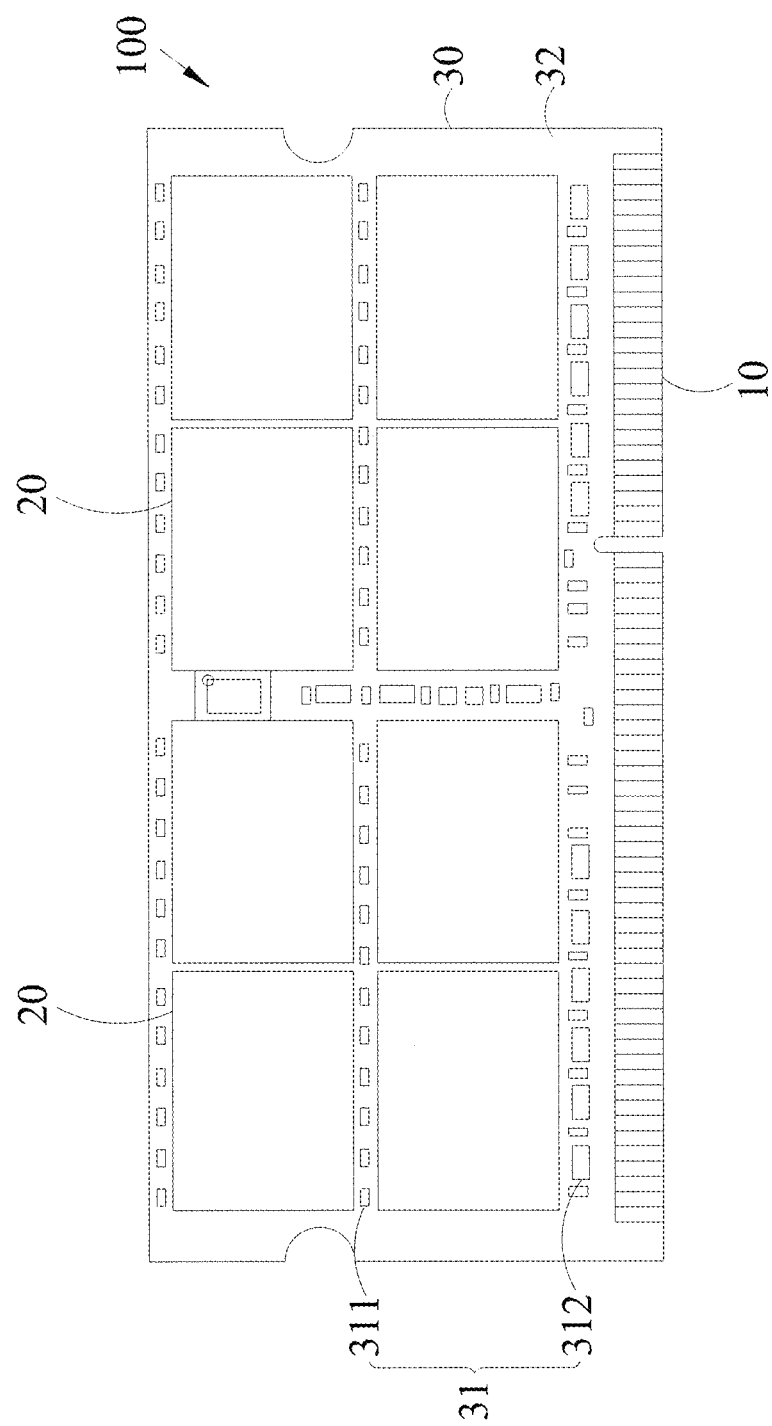
FIG. 2 is a front view of the anti-sulfurization memory storage device of the present invention.
Figure 3:
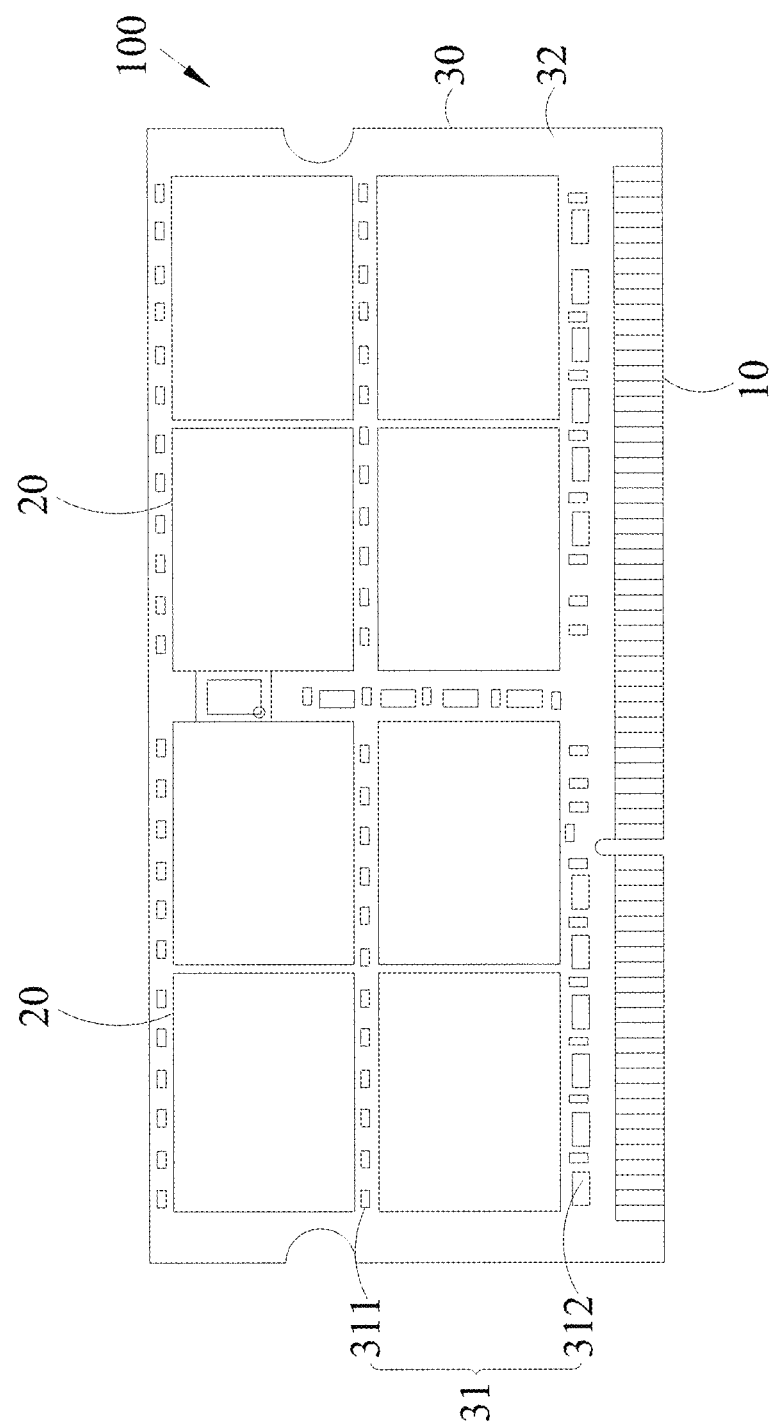
FIG. 3 is a rear view of the anti-sulfurization memory storage device of the present invention.

The following makes reference to FIGS. 2 and 3, which are respectively the front and rear views of the anti-sulfurization memory storage device of the present invention. In the present embodiment, the anti-sulfurization memory storage device 100 is illustrated as a SODIMM, which may include a connection interface unit 10, a plurality of volatile memory units 20, and a printed circuit board 30. The plurality of volatile memory units 20 may be made of multiple memory chips, and the connection interface unit 10 may be a metal terminal. The plurality of volatile memory units 20 and the connection interface unit 10 are located on the printed circuit board 30.

It is noteworthy that although the aforementioned memory storage device is illustrated as a SODIMM, it is not limited thereto; the memory storage device may also be illustrated as Error-Correcting Code Unbuffered Dual In-Line Memory Module (ECC UDIMM), ECC Small Outline Dual In-Line Memory Module, Load Reduced DIMM (LRDIMM), UDIMM, and RDIMM.

As shown in the drawings, the connection interface unit 10 may be coupled to a host, wherein the method of coupling involves the insertion of the connection interface unit 10 into a memory slot on the motherboard of the host, thus allowing the power or data transmission to take place. The thickness of the connection interface unit 10 may be between 20 and 30 micrometers, or more preferably, the thickness of the connection interface unit 10 may be between 35 and 45 micrometers, in order to endow the connection interface unit 10 with higher resistance to wear and higher hot-plug cycle count.

Furthermore, the printed circuit board 30 may include a plurality of anti-sulfurization passive components 31 and a protective film 32, wherein the plurality of anti-sulfurization passive components 31 may include an anti-sulfurization resistor 311 and an anti-sulfurization resistor network 312, which may be used to control and transmit electrical current to the volatile memory units 20, where the electrical current is provided by the host through the connection interface unit 10.

The protective film 32 covers the printed circuit board 30. More specifically, the protective film 32 may cover the printed circuit board 30 by way of employing conformal coating technology, to cause the elements on the printed circuit board 30 to be moisture-proof, dust-proof, fouling-proof, and enhance their resistance to wear.

In one embodiment, when the anti-sulfurization passive component 31 is an anti-sulfurization resistor 311, the nominal resistance of the anti-sulfurization resistor 311 is rated at 240 ohms at the temperature of 25 degrees Celsius, and the tolerance of the anti-sulfurization resistor 311 is 5%.

In a preferred embodiment, when the anti-sulfurization passive component 31 is an anti-sulfurization resistor 311, the nominal resistance of the anti-sulfurization resistor 311 is rated at 240 ohms at the temperature of 25 degrees Celsius, and the tolerance of the anti-sulfurization resistor 311 is 3%.

In another preferred embodiment, when the anti-sulfurization passive component 31 is an anti-sulfurization resistor 311, the nominal resistance of the anti-sulfurization resistor 311 is rated at 240 ohms at the temperature of 25 degrees Celsius, and the tolerance of the anti-sulfurization resistor 311 is 1%

In yet another preferred embodiment, when the anti-sulfurization passive component 31 is an anti-sulfurization resistor network 312 and the temperature is 25 degrees Celsius, the lowest resistance of the anti-sulfurization resistor network 312 is 15 ohms and the highest resistance thereof is 39 ohms, wherein the anti-sulfurization resistor network 312 includes 4 and 2 identical resistors. More specifically, the specification of the anti-sulfurization resistor network 312 may be 4P2R and 8P4R. In the present embodiment, the anti-sulfurization resistor network 312 with four and two resistors is for illustration only and shall not limit the scope of the present invention; when actually implementing the present invention, the anti-sulfurization resistor network may be designed with other numbers of resistors according to the needs of the user.

It is worth noting that the anti-sulfurization memory storage device of the present invention utilizes anti-sulfurization resistors or anti-sulfurization resistor networks with a small tolerance, which is capable of preventing electrical currents much larger than the required nominal values from passing through the memory storage device, as electrical currents larger than can be tolerated would cause damage to the memory storage device.

In summary, the anti-sulfurization memory storage device of the present invention utilizes anti-sulfurization passive components instead of traditional passive components; it also includes a protective film to cover and make its electrical components dust-proof and moisture-proof, and enhance their resistance to wear. This effectively maintains the electric conductivity of the memory storage device for the duration of its lifetime, as well as prolonging said lifetime.

The aforementioned description is for the purpose of illustration only and shall not be interpreted in any way to limit the scope, applicability or configuration of the present invention. A person skilled in the art may carry out many changes and modifications in the described embodiments without departing from the scope and the spirit of the present invention, as the scope is intended to be limited only by the appended claims.

What is claimed is:

1. An anti-sulfurization memory storage device comprising:
    a connection interface unit to be coupled to a host;
    a plurality of volatile memory units; and
    a printed circuit board comprising a plurality of anti-sulfurization passive components and a protective film, wherein the plurality of anti-sulfurization passive components are used to control and transmit an electrical current to the plurality of volatile memory units and comprise an anti-sulfurization resistor and an anti-sulfurization resistor network, and the protective film is used to cover the printed circuit board.

2. The anti-sulfurization memory storage device of claim 1, wherein a nominal resistance of the anti-sulfurization resistor is 240 ohms.

3. The anti-sulfurization memory storage device of claim 2, wherein a tolerance of the anti-sulfurization resistor is 5%.

4. The anti-sulfurization memory storage device of claim 2, wherein a tolerance of the anti-sulfurization resistor is 3%.

5. The anti-sulfurization memory storage device of claim 2, wherein a tolerance of the anti-sulfurization resistor is 1%.

6. The anti-sulfurization memory storage device of claim 1, wherein a lowest resistance of the anti-sulfurization resistor network is 15 ohms.

7. The anti-sulfurization memory storage device of claim 1, wherein a highest resistance of the anti-sulfurization resistor network is 39 ohms.

8. The anti-sulfurization memory storage device of claim 1, wherein the connection interface unit is a metal terminal and a thickness of the metal terminal is between 20 and 30 micrometers.

9. The anti-sulfurization memory storage device of claim 1, wherein the connection interface unit is a metal terminal and a thickness of the metal terminal is between 35 and 45 micrometers.

* * * * *